(12) United States Patent
Black et al.

(10) Patent No.: US 8,416,485 B2
(45) Date of Patent: Apr. 9, 2013

(54) DESIGNING THE HOST OF NANO-STRUCTURED OPTOELECTRONIC DEVICES TO IMPROVE PERFORMANCE

(75) Inventors: Marcie R. Black, Lincoln, MA (US); Brent A. Buchine, Watertown, MA (US)

(73) Assignee: Bandgap Engineering, Inc., Woburn, MA (US)

( * ) Notice: Subject to any disclaimer, the term of this patent is extended or adjusted under 35 U.S.C. 154(b) by 0 days.

(21) Appl. No.: 13/154,107

(22) Filed: Jun. 6, 2011

(65) Prior Publication Data

US 2011/0232756 A1    Sep. 29, 2011

Related U.S. Application Data

(63) Continuation of application No. 12/418,229, filed on Apr. 3, 2009, now Pat. No. 7,973, 995.

(60) Provisional application No. 61/042,124, filed on Apr. 3, 2008.

(51) Int. Cl.
*G02F 1/03* (2006.01)

(52) U.S. Cl.
USPC .......................................... 359/241; 359/245

(58) Field of Classification Search .................. 359/245, 359/241, 246, 248, 254, 326
See application file for complete search history.

(56) References Cited

U.S. PATENT DOCUMENTS

2007/0278476 A1 * 12/2007 Black .............................. 257/14

OTHER PUBLICATIONS

Manera et al., "Optical gas sensing of TiO2 and TiO2/Au nanocemposite thin films"; 2008, Elservier, Sensor and Actuators, pp. 107-115.*

* cited by examiner

*Primary Examiner* — James Jones
(74) *Attorney, Agent, or Firm* — Wilmer Cutler Pickering Hale & Dorr LLP

(57) ABSTRACT

A nanostructured optoelectronic device is provided which comprises a nanostructured material and a host material intermingled with the nanostructured material. The host material may have a higher index of refraction than the nanostructured material. The host material's index of refraction may be chosen to maximize the effective active area of the device. In an alternative embodiment, the host material comprises scattering centers or absorption/luminescence centers which absorb light and reemit the light at a different energy or both.

12 Claims, 6 Drawing Sheets

DESIGNING THE HOST OF NANO-STRUCTURED OPTOELECTRONIC DEVICES TO IMPROVE PERFORMANCE

CROSS-REFERENCE TO RELATED APPLICATIONS

This application claims priority to U.S. patent application Ser. No. 12/418,229, filed Apr. 3, 2009, which claims priority to U.S. Provisional Patent Application No. 61/042,124, filed Apr. 3, 2008. These applications are incorporated by reference in their entirety.

TECHNICAL FIELD

This invention relates generally to nanostructured opto-electronic devices.

BACKGROUND OF THE INVENTION

The properties of nanostructures differ from those of bulk materials. Hence, when designing opto-electronic materials, it is often desirable to use nano-structured materials (nano-dots, nano-wires, or nano-wells) to optimize for performance. However, macroscopic devices with nano-materials inherently consist of more than one material. Hence, if only one of the materials is useful for device operation, the effective or useful volume of the device is smaller than the actual volume of the device, since the non-active material takes up volume as well.

Light and electromagnetic fields travel through a material in a way which depends on the material's complex index of refraction. Others have adjusted the surrounding inactive material near the active material in order to increase the absorption of light in the active material. For example, the index of refraction of the incidence medium may be chosen to be large relative to the sample, thus increasing the optical absorption in the sample. (T. Lummerstorfer et al., Analytical and Bioanalytical Chemistry, vol. 388, pp. 55-64 (2007).)

SUMMARY OF THE INVENTION

A nanostructured optoelectronic device is provided which comprises a nanostructured material and a host material intermingled with the nanostructured material. The host material may have a higher index of refraction than the nanostructured material. The host material index of refraction may be chosen to maximize the effective active area of the device. In an alternative embodiment, the host material comprises scattering centers or absorption/luminescence centers which absorb light and reemit the light at a different energy or both.

The embodiments described herein differ from prior art concepts in that they describe how the host material, which is the inactive material in between the nano materials, can be used to improve the efficiency of an opto-electronic device. Ordinarily the purpose of the host is only to electrically isolate the nano-particles to allow for the desired change on the electrical and optical properties of the material. In some situations, the host also provides structural support. We describe using the host material to assist the active material in performance.

This application lists four example designs where a host material can improve optoelectronic performance. These designs funnel light into the active region. The first method does this by having a large index of refraction of the inactive material relative to the active material. Thus it makes use of the lack of homogeneity inherent in nano-materials to funnel the light into the active region in an amount disproportionate to the volume percentage. The second method introduces scattering centers. The third method introduces absorption/luminescence centers. The fourth uses metal particles or thin films with plasmon coupling into the active area. All four approaches increase the light absorbed in the active nanostructures.

DETAILED DESCRIPTION OF THE INVENTION

Figure 1:
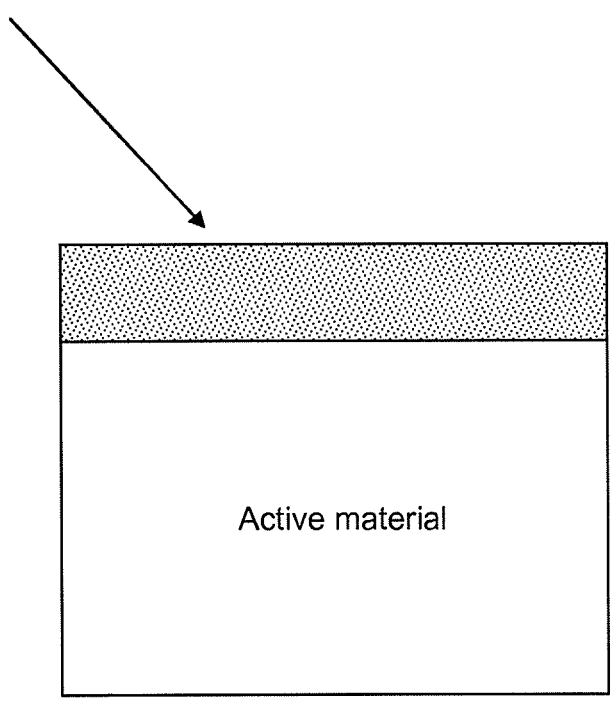
FIG. 1 shows how a large index of refraction of the incident material increases the absorption inside the sample.

Before describing the present invention in detail, it is to be understood that this invention is not limited to specific solvents, materials, or device structures, as such may vary. It is also to be understood that the terminology used herein is for the purpose of describing particular embodiments only, and is not intended to be limiting.

As used in this specification and the appended claims, the singular forms "a," "an," and "the" include both singular and plural referents unless the context clearly dictates otherwise. Thus, for example, reference to "a nanowire" includes a plurality of nanowires as well as a single nanowire, reference to "a temperature" includes a plurality of temperatures as well as single temperature, and the like.

Where a range of values is provided, it is intended that each intervening value between the upper and lower limit of that range and any other stated or intervening value in that stated range is encompassed within the disclosure. For example, if a range of 1 μm to 8 μm is stated, it is intended that 2 μm, 3 μm, 4 μm, 5 μm, 6 μm, and 7 μm are also disclosed, as well as the range of values greater than or equal to 1 pm and the range of values less than or equal to 8 μm.

A nanostructured optoelectronic device is provided which comprises a nanostructured material and a host material intermingled with the nanostructured material. The host material may have a higher index of refraction than the nanostructured material. The host material index of refraction may be chosen to maximize the effective active area of the device. In an alternative embodiment, the host material comprises scattering centers or absorption/luminescence centers which absorb light and reemit the light at a different energy or both.

The inactive material in the nanostructured device could be seen as occupying volume which could otherwise consist of active material, e.g., material in which electron-hole pairs are generated in a photovoltaic device. The inactive material thus reduces by the space it occupies the active area of the device, relative to a non-nanostructured device of the same volume. Techniques are provided to minimize the adverse impact of the inactive material on the effective area of the device. In other words, the device will function as if a larger percentage of active material is present than what is physically present. This is accomplished by introducing functionality into the inactive material so that even though the inactive material doesn't participate in (e.g., in photovoltaics) electricity production, it assists the active region in electricity production.

In the first example, this is accomplished by introducing an inactive material with an index of refraction such that the light is encouraged by the presence of the inactive material to enter into the active material. The ranges of the index of refraction of the inactive material which increase the effective active area over the physical active area, is counter-intuitive and in some cases the opposite of the more common example of an optical waveguide. An optical waveguide is designed to confine light inside the waveguide core, and hence minimize the amount of light in the outer/cladding layer. In order to confine the light inside the core, the index of refraction of the core needs to be larger than that of the cladding. This allows for total internal reflection and most of the light to remain inside the core. In most cases, the cladding is ideally not optically active and non-absorbing. So, in a waveguide the material for the cladding is chosen so that the index of refraction is less than that of the core.

In nano-materials, the sizes of the nano materials are smaller than the wavelength of light in the energy range of interest. Hence, the waveguide analogy is not accurate. The inactive material should, as in the waveguide case, be non-absorbing. However, light cannot be encouraged to enter into the active material by choosing an inactive material with an index of refraction less than that of the active material. Instead, by calculating the ideal index of refraction of the inactive host, and finding materials close to this ideal index of refraction, light is encouraged to enter into the active material.

This counterintuitive result can be derived from either first principles Maxwell's equations or from effective medium theory, which is an approximation of Maxwell's Equations. Effective medium theory is a way to estimate the optical response of a composite material when the optical properties of the materials, which make up the composite, are known. It is basically an average of the optical properties, but a nonlinear weighted average. Nanomaterials are usually made of two materials (one is often air). In the Maxwell-Garnett Effective Medium Theory, the complex dielectric function of the nanocomposite ($\epsilon_{composite}$) is related to the complex dielectric function of the active ($\epsilon_{active}$) and inactive ($\epsilon_{inactive}$) materials by the equation $$\frac{\epsilon_{composite} - \epsilon_{inactive}}{\epsilon_{composite} + K * \epsilon_{inactive}} = f \frac{\epsilon_{active} - \epsilon_{inactive}}{\epsilon_{active} + K * \epsilon_{inactive}}$$

In this equation, f is the volume fraction of active material in the composite and K is the screening parameter. K depends on the shape of the active materials and for infinitesimally small nanowires K=1.

Effective medium theory predicts that when the size of the nanomaterial is smaller than the wavelength of light, the material with the lowest dielectric constant in the energy of interest dominates more than its volume average indicates. Thus for solar cells and detectors made from nanomaterials, in general the ideal host material is a material which is optically transparent in the energy range of interest, electrically insulating, and has an index of refraction larger than the active material.

When the active material has a significant absorption coefficient, the trend is the same, but the inactive material is required to have an even larger index of refraction to effectively encourage the light to enter into the active region.

Figure 2:
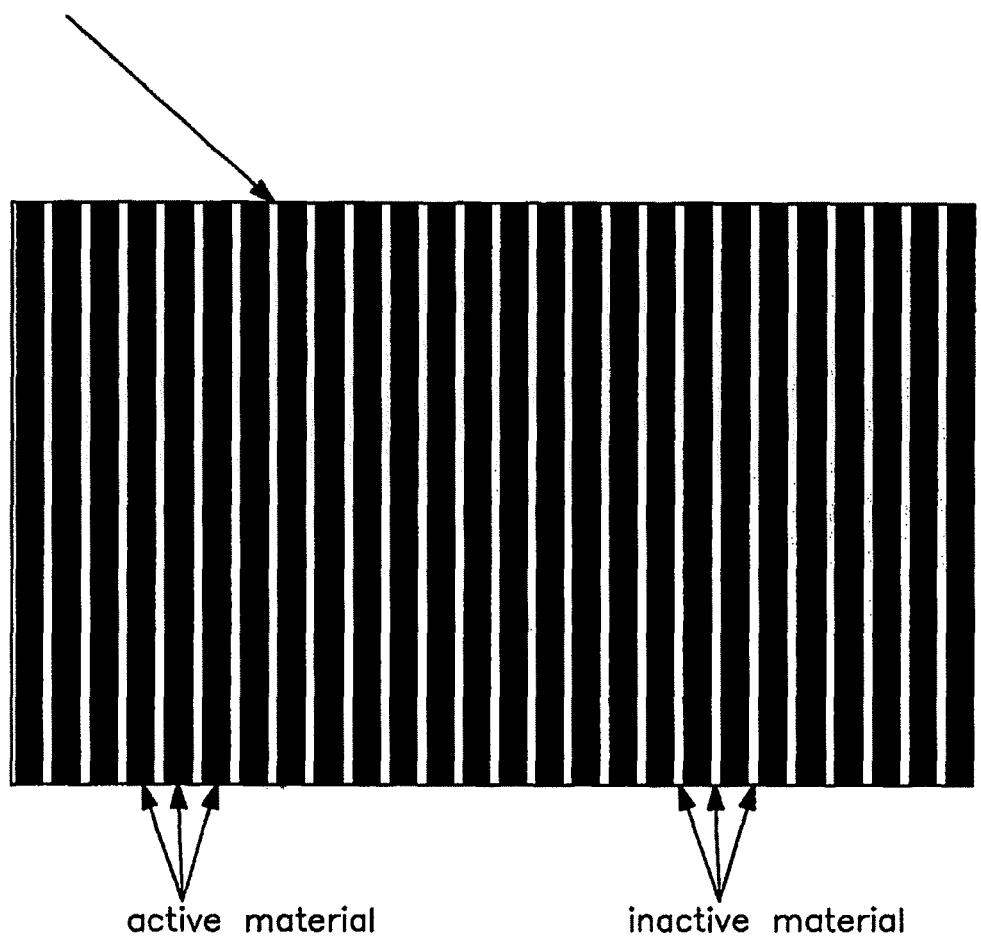
FIG. 2 schematically depicts an array of micro/nano wires inside a template in which the template does not have the desired optical properties.
Figure 3:
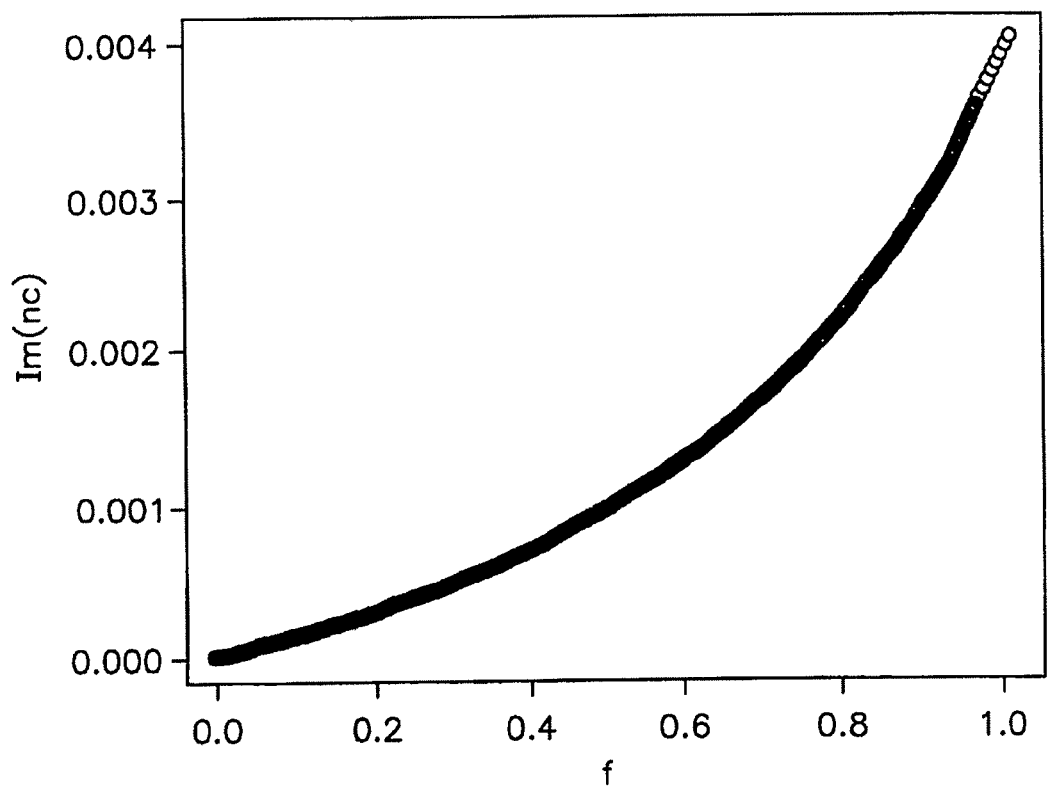
FIG. 3 graphs the imaginary part of the index of refraction for a composite material made up of two constituents with indexes of refraction $1.97+0.00405i$ and 1. The x-axis is f, the percentage of the composite made up of the material with index of refraction equal to $1.97+0.00405i$.

For the example of silicon nanowires inside an air host, the imaginary part of the index of refraction, which is directly proportional to the absorption of light inside the composite, is related the actual volume percentage, f, shown in FIG. 2. If the effective active area were equal to the actual active area, FIG. 2 would be a straight line between 0 at f=0 and the bulk absorption coefficient at f=1. In actuality, the effective active area is below that of the actual active area making these devices unnecessarily inefficient.

Figure 4:
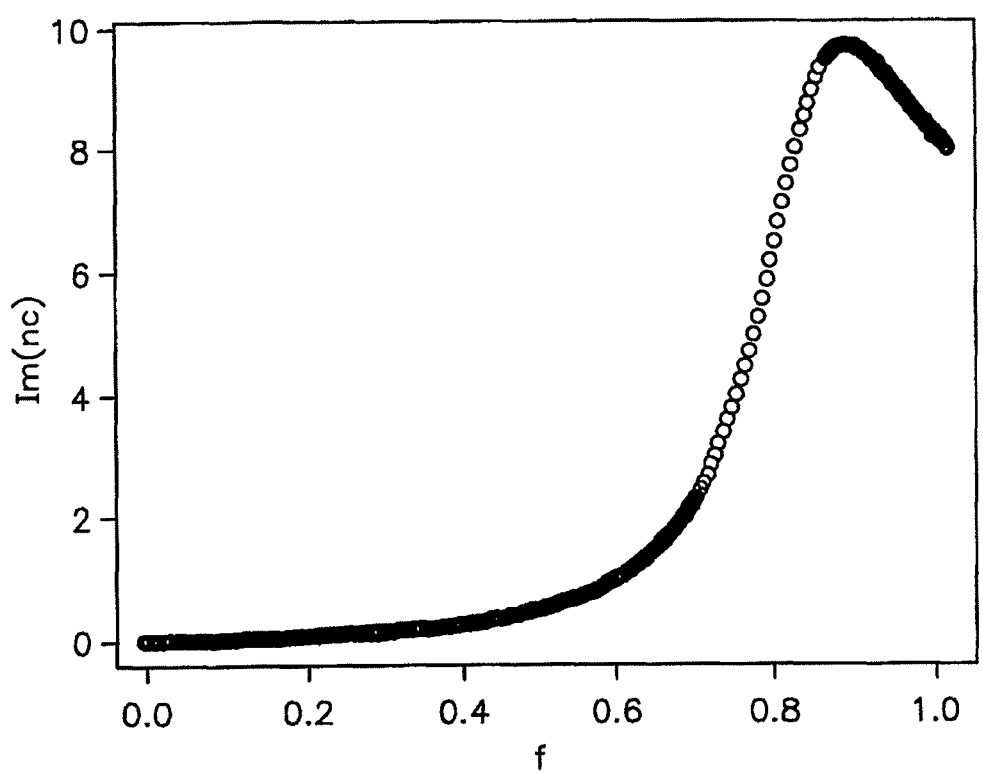
FIG. 4 graphs the imaginary part of the index of refraction for a composite material made up of two constituents with indexes of refraction $1.975+8i$ and 2.77. The x-axis is f, the percentage of the composite made up of the material with index of refraction equal to $1.975+8i$.

By selecting the optimized host material, the effective active area can be increased to that above the actual active area. For example, FIG. 4 shows the absorption coefficient for a composite when the index of refraction of the active material is 1.975+8i and the index of refraction of the host material is 2.77. As can be seen by this example, in some cases the conscious design of the host material can greatly increase the effective area of a device. The amount of increase in the effective active area of the device relative to the actual area of the device depends on the volume fraction f, the complex index of refraction of the active area, and the complex index of refraction of the inactive area.

Figure 5:
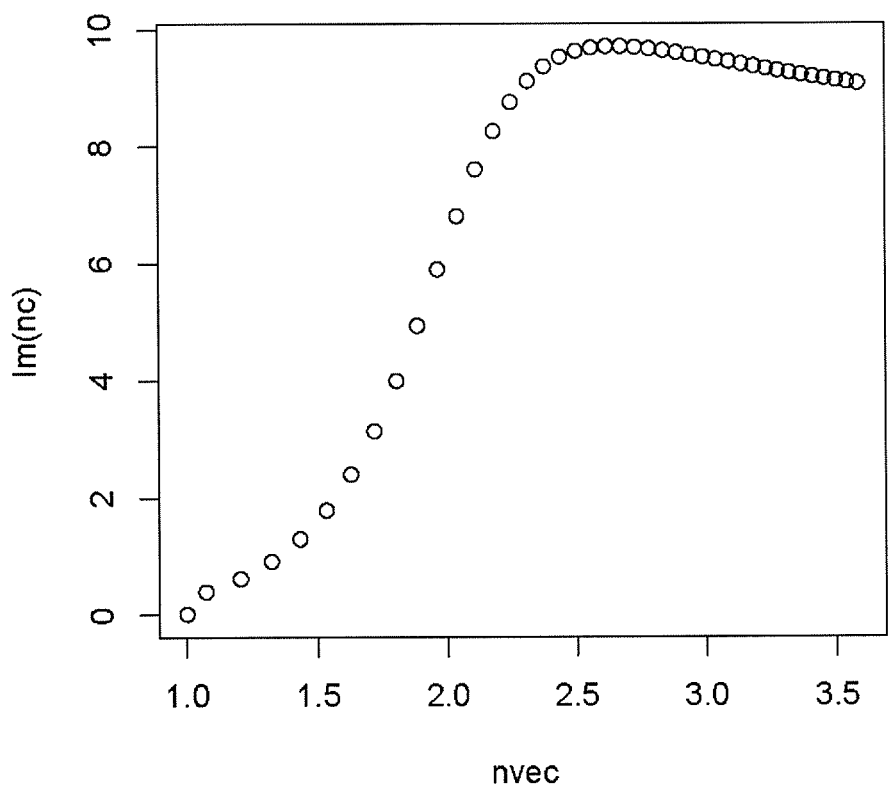
FIG. 5 depicts the optical absorption of the composite (host material plus the active material) vs. the index of refraction of the host material (the optical absorption of the host being set to zero). The active material has a complex index of refraction of $1.974846+8.004051i$.

FIG. 5 further illustrates the effect of host materials of different indices of refraction on the optical absorption. In this figure, the active material has a complex index of refraction chosen to approximate that of a silicon nanowire array. In general one wants to have increase the optical absorption relative to a baseline, e.g., one where the host material is air which has an index of refraction of approximately 1. In the figure it is seen that the optical absorption can be increased considerably from the baseline value. Improvements of at least about 10%, at least about 20%, at least about 30%, or at least about 50% with respect to a baseline may be desired. These improvements may be in terms of a number of figures of merit, for example the imaginary part of the index of refraction, the effective active area, or other figures of merit relating to optical absorption.

The following are exemplary applications of selecting a large index of refraction host material to increase performance of the active region:

Quantum dot detectors, solar cells, and down converters. The bandgaps of quantum dots increase with decreasing quantum dot size. Hence, the optical absorption and emission are tunable which makes quantum dots very valuable for light emission, detection, or down conversion applications. The quantum dots are inside another material, which sometimes is required to be electrically conducting. This material is often an organic material, which usually has a dielectric function slightly less than 2. The quantum dots are usually made of inorganic materials, and have dielectric functions much larger than the organic host material. If the host material is altered to a material with a larger index of refraction (for example $TiO_2$), less quantum dots are needed to be in the composite to absorb/emit the same amount of light. This has advantages including decreased cost, processing ease, and increased sensitivity of the detectors.

Nanowire photovoltaic and detectors. Like quantum dots, the bandgap of nanowires increase with decreasing wire diameter. However, nanowires have the added advantage that in one dimension they are continuous. Hence for applications that require electrical conduction nanowires have an advantage. Hence, some companies are looking into nanowire solar cells and nanowire detectors. (E.g., U.S. Published Patent Application No. 2007/0107103 to Krzysztof J. Kempa, Michael J. Naughton, Zhifeng Ren, and Jakub A. Rybczynski; U.S. Published Patent Application No. 2007/0278476 to M. Black; and Zhihong Huang, James E. Carey, Mingue Liu, Xiangyi Guo, and Eric Mazur, "Microstructured Silicon Photodetector," Applied Physics Letters, Vol. 89, page 033506 (Jul. 20, 2006), all of which are incorporated herein by reference).

To maximize efficiency of solar cells, they should absorb as much of the light from the sun as possible. This requires thicker solar cells. However as the thickness of the solar cell is increased, the cost, leakage current, and resistance all undesirably increase. If the host material (that which surrounds the nanowires) is chosen to be a material that is optically transparent, electrically insulating, and with an optimized index of refraction, the optical absorption of the composite will increase. In addition, even if the host has a small amount of optical absorption, encouraging the light to enter into the nanowire and not the host material will minimize the negative effect the small optical absorption of the host has on the device performance. Choosing the right host material will increase the performance of the solar cell and allow designs with thinner cells. For the example of silicon nanowires solar cells, a change from air surrounding the nanowires to $TiO_2$ will increase the effective active area.

Where the device is a solar cell array, it may be desired that the nanowires be tapered. A discussion of nanowire taper is found, for example, in U.S. Provisional Patent Application No. 61/141,082 filed Dec. 29, 2008. For example, with a slight taper, free carriers in the nanowire will bounce off the edges of the wire and thus tend propagate downward to the substrate. If the p-n junction of the photovoltaic cell is in the substrate rather than in the nanowires, this increased diffusion towards the substrate may be expected to increase the cell efficiency. Desirable taper angles might be, for example, no more than about 0.5 degrees, about 1 degree, about 2 degrees, or about 4 degrees, or in a range between about 0.5 degrees and about 1 degree, about 2 degrees, or about 4 degrees.

Another example of using the inactive host to increase the performance of the active nanostructured material is by placing scattering centers inside the host. The scattering centers will take light that would have transmitted through the sample and scatter it so that part of this light enters into the active region of the device and thus can contribute to the device performance. Some examples of scattering centers that could be added to the non-active portion of a nanowire solar cell are quantum dots, metal nanoparticles, and high index dielectric nanodots.

A third example of using the inactive host to increase the performance of the active nanostructured material is by placing absorption/luminescence centers inside the host material of a nanowire array. The absorption/luminescence centers absorb and reemit the light at a different (usually lower, but in the case of up converters higher) energy. If the absorption/luminescence center is chosen so that the emitted light is near the band edge energy, the reemitted light can be absorbed into the nanostructure and contribute to improving device efficiency. Many organic dyes make nice absorption/luminescent centers. In one example, waveguides are used to transport photons emitted from organic absorption/luminescent centers to solar cells several centimeters away from the luminescent centers. (Currie M J, Mapel J K, Heidel T D, Goffri S, Baldo M A, High-Efficiency Organic Solar Concentrators for Photovoltaics, Science, Vol. 321, pp. 226-228 (Jul. 11, 2008).)

Figure 6:
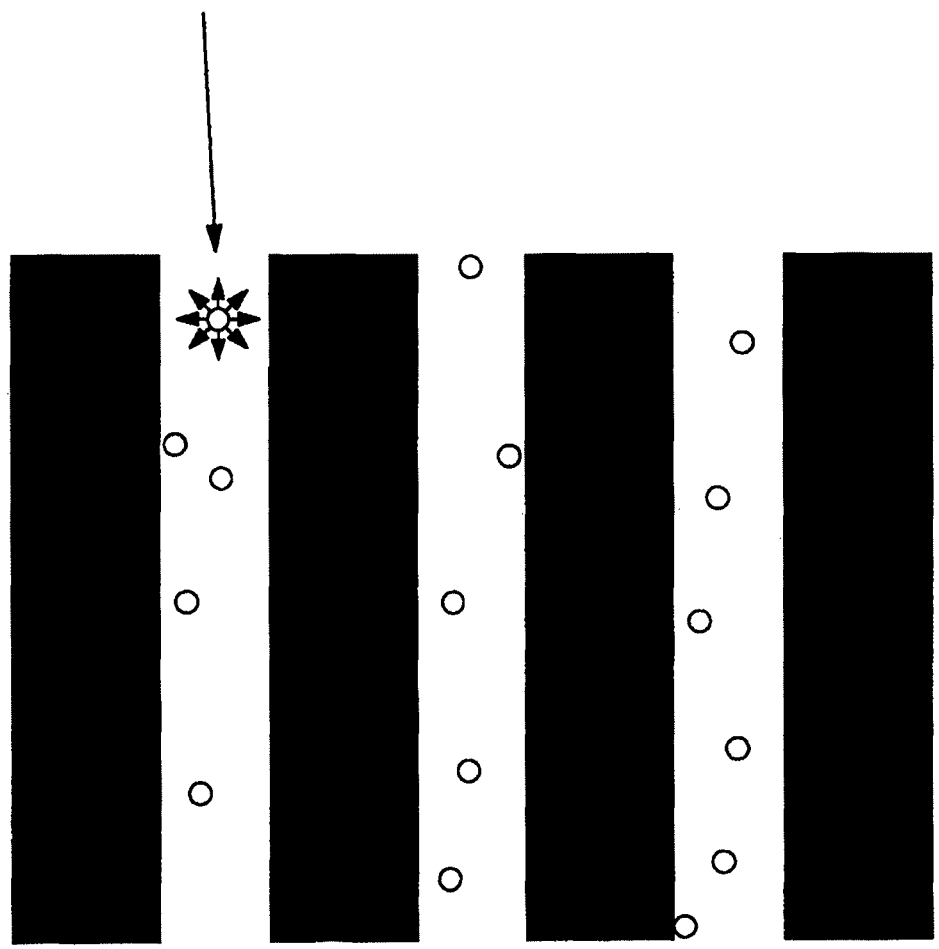
FIG. 6 depicts a composite of the invention which the host material comprises scattering centers and/or luminescence centers.

FIG. 6 depicts a nanostructure where there are scattering or absorption/luminescence centers in the host. The centers are depicted as dots. Arrows are shown pointing away from one of the dots to symbolize the scattering or absorption/luminescence.

Another type of absorption reemitting processing is metal particles, which transfer energy to the nanowire solar cells through a plasmon resonance. The photon is absorbed in the metal particle, excites a plasmon resonance and transfers some of this energy to the nanowire solar cell if the nanowire solar cell is within a decay length away from the metal particle. The principle of plasmon enhanced absorption and energy transfer to solar cells is demonstrated by many groups (e.g. J. K. Mapel, M. Singh, M. A. Baldo, "Plasmonic Excitation of Organic Double Heterostructure Solar Cells," Applied Physics Letters, Vol. 90, page 121102 (2007); and U.S. Patent Publication 2007/0289623 to Harry Atwater, both of which are incorporated herein by reference). In our described embodiment, we place the metal particles inside the nanostructure of the material, as opposed to the other examples of plasmon resonance, which place the metal film near the solar cell, but not inside the nanomaterial.

In summary, normally the host of a nanosystem is chosen only for structural integrity and so that it does not interfere with the performance of the active nanomaterials. Here we list examples of ways in which the inactive material can enhance the performance of the active materials. By choosing a host material with an index of refraction larger than the active material or by adding scattering centers, absorption/luminescence centers, or plasmon resonators inside the host, the effective volume parentage of active material can be increased so that it is larger than the actual volume percentage of active material.

Devices of the invention may be manufactured by methods known in the art. Reference is made, for example, for example, to Sami Franssila, *Introduction to Microfabrication* (John Wiley & Sons, 2004), and the references cited there.

All patents, patent applications, and publications mentioned herein are hereby incorporated by reference in their entireties. However, where a patent, patent application, or publication containing express definitions is incorporated by reference, those express definitions should be understood to apply to the incorporated patent, patent application, or publication in which they are found, and not to the remainder of the text of this application, in particular the claims of this application.

The invention claimed is:

1. A nanostructured optoelectronic device comprising a nanostructured material and a host material intermingled with the nanostructured material, wherein the device has an effective active area, wherein the nanostructured material is a material in which electron-hole pairs are generated in the nanostructured optoelectronic device, wherein the host material has an index of refraction which approximately maximizes the effective active area of the device as a function of the host material's index of refraction.

2. The optoelectronic device in claim 1, wherein the host material has a higher index of refraction than the nanostructured material.

3. The optoelectronic device of claim 1, wherein the nanostructured material comprises nanowires.

4. The optoelectronic device of claim 1, wherein the nanostructured material comprises quantum dots.

5. The optoelectronic device of claim 1, wherein the nanostructured material comprises silicon.

6. The optoelectronic device of claim 1, wherein the host material increases the effective active area by at least about 10% compared to a device having the same structure except that the host material has an index of refraction of approximately 1.

7. The optoelectronic device of claim 6, wherein the host material increases the effective active area by at least about 10% compared to a device having the same structure except that the host material is replaced with air.

8. The optoelectronic device of claim 1, wherein the host material comprises $TiO_2$.

9. The optoelectronic device of claim 1, wherein the device is a photovoltaic device.

10. The optoelectronic device of claim 9, wherein the nanostructured material comprises a nanowire array.

11. The optoelectronic device of claim 9, wherein the nanowires in the nanowire array have a taper in a range between about 1 degree and about 3 degrees.

12. The optoelectronic device of claim 1, wherein the device is a light-emitting diode.

\* \* \* \* \*